United States Patent
Freitag et al.

(10) Patent No.: US 7,564,659 B2
(45) Date of Patent: *Jul. 21, 2009

(54) MAGNETORESISTIVE SENSOR HAVING AN ANISOTROPIC PINNED LAYER FOR PINNING IMPROVEMENT

(75) Inventors: James Mac Freitag, Sunnyvale, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 396 days.

This patent is subject to a terminal disclaimer.

(21) Appl. No.: 11/200,796

(22) Filed: Aug. 9, 2005

(65) Prior Publication Data

US 2007/0035894 A1    Feb. 15, 2007

(51) Int. Cl.
*G11B 5/39* (2006.01)
(52) U.S. Cl. .................. 360/324.11; 360/324.2

(58) Field of Classification Search .............. 360/324.1, 360/324.11, 324.12, 324.2
See application file for complete search history.

(56) References Cited

U.S. PATENT DOCUMENTS

| | | | |
|---|---|---|---|
| 7,061,728 B2* | 6/2006 | Pinarbasi | 360/320 |
| 7,170,725 B1* | 1/2007 | Zhou et al. | 360/324.11 |
| 7,189,583 B2* | 3/2007 | Drewes | 438/3 |
| 2004/0072036 A1* | 4/2004 | Kubota et al. | 428/694 TS |

\* cited by examiner

*Primary Examiner*—Jefferson Evans
(74) *Attorney, Agent, or Firm*—Zilka-Kotab, PC

(57) ABSTRACT

A magnetoresistive sensor having a magnetically anisotropic pinned layer structure. The pinned layer structure is formed over a seed layer having a surface that has been treated to texture the surface of the seed layer with an anisotropic roughness. This anisotropic roughness induces the magnetic anisotropy in the pinned layers. The treated seed layers also allow the pinned layer to maintain robust pinning without the need for a thick AFM layer, thereby reducing gap size.

18 Claims, 7 Drawing Sheets

MAGNETORESISTIVE SENSOR HAVING AN ANISOTROPIC PINNED LAYER FOR PINNING IMPROVEMENT

FIELD OF THE INVENTION

The present invention relates to pinning of a pinned layer in a magnetoresistive sensor and more particularly to forming a magnetically anisotropic pinned layer on a seed layer treated with an anistropic roughness.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of Angstroms. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetic moment, when exchange coupled with a magnetic material, it can strongly pin the magnetization of the ferromagnetic layer.

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for increased data rate and data capacity has lead a push to make magnetoresistive sensors ever smaller. The various dimensions scale together, so that in making the track width of a sensor smaller, the stripe height must also be reduced. One problem that arises as a result of such small sensor dimensions, is that the pinned layer moment becomes unstable. Traditional pinning mechanisms alone, such as AFM pinning, and AP coupling, become insufficient to maintain pinning of the pinned layer magnetic moment.

As those skilled in the art will appreciate, the distance between the shields (gap thickness) determines the bit length for the read sensor. With the ever increasing pressure to increase data capacity and data rate, engineers are constantly under pressure to decrease the bit length (and therefore gap thickness) of read sensors. One way to greatly decrease the gap thickness of the sensor would be to eliminate the AFM layer. In order to function as an antiferromagnetic material layer and properly exchange couple with the pinned layer, the AFM layer must be made very thick (75-200 Angstroms), which is much thicker than any of the other layers in the sensor stack. However, as mentioned above, maintaining pinned layer pinning in ever smaller sensors is already a problem, even when using an AFM layer.

Therefore, a novel pinning mechanism is needed that can maintain pinned layer moment robustness in extremely small magnetoresistive sensors. Preferably, such a pinning mechanism would sufficiently maintain robust pinned layer pinning that the relatively thick AFM layer could be eliminated or at least have a greatly reduced thickness, in order to decrease the gap thickness of the sensor.

SUMMARY OF THE INVENTION

The present invention provides magnetoresistive sensor having an anisotropic pinned layer. The pinned layer is formed on a seed layer, having a surface configured with an anisotropic roughness. The anisotropic roughness of the seed layer surface induces the magnetic anisotropy in the pinned layer which ensures robust pinning, even without exchange coupling with an antiferromagnetic (AFM) layer.

The anistotropic roughness can be formed in the surface of the seed layer by a low power ion mill, performed at an oblique angle with respect to a normal to the surface of the seed layer. The ion mill can be performed using a 9 zone ion extraction grid and can be performed at a voltage of 20V-100V or about 50V. The ion mill is preferably performed at an angle of 20-80 degrees or more preferably at an angle of 35-65 degrees with respect to a normal to the surface of the seed layer.

The seed layer can be, for example NiFeCr, PtMn, IrMn or another, preferably crystalline, material, and can have a thickness of 20-120 Angstroms. The seed layer can be deposited on a substrate that may, for example be a non-magnetic, electrically insulating gap layer (in the case of a CIP sensor) or may be a non-magnetic, electrically conductive shield (in the case of a CPP sensor).

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
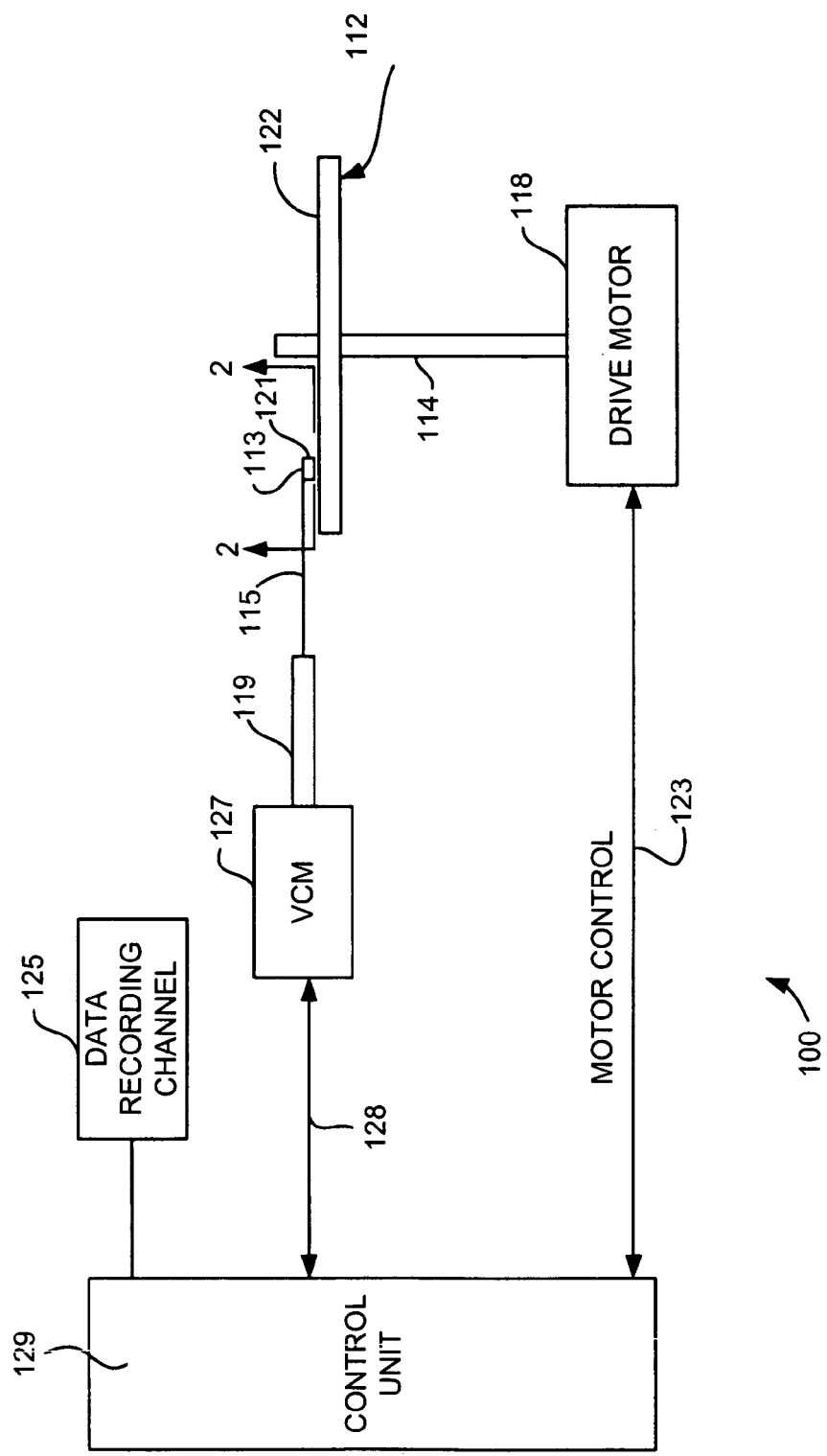
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
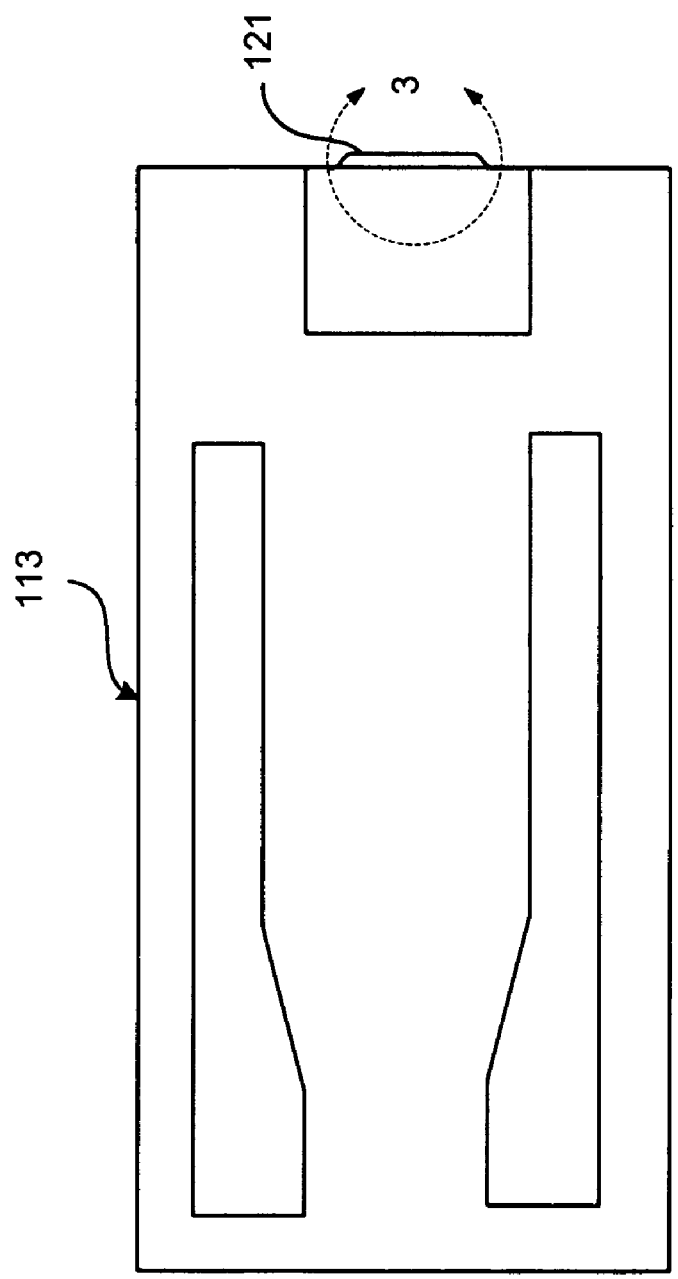
FIG. 2 is an ABS view of a slider, taken from line 3-3 of FIG. 2, illustrating the location of a magnetic head thereon.
Figure 3:
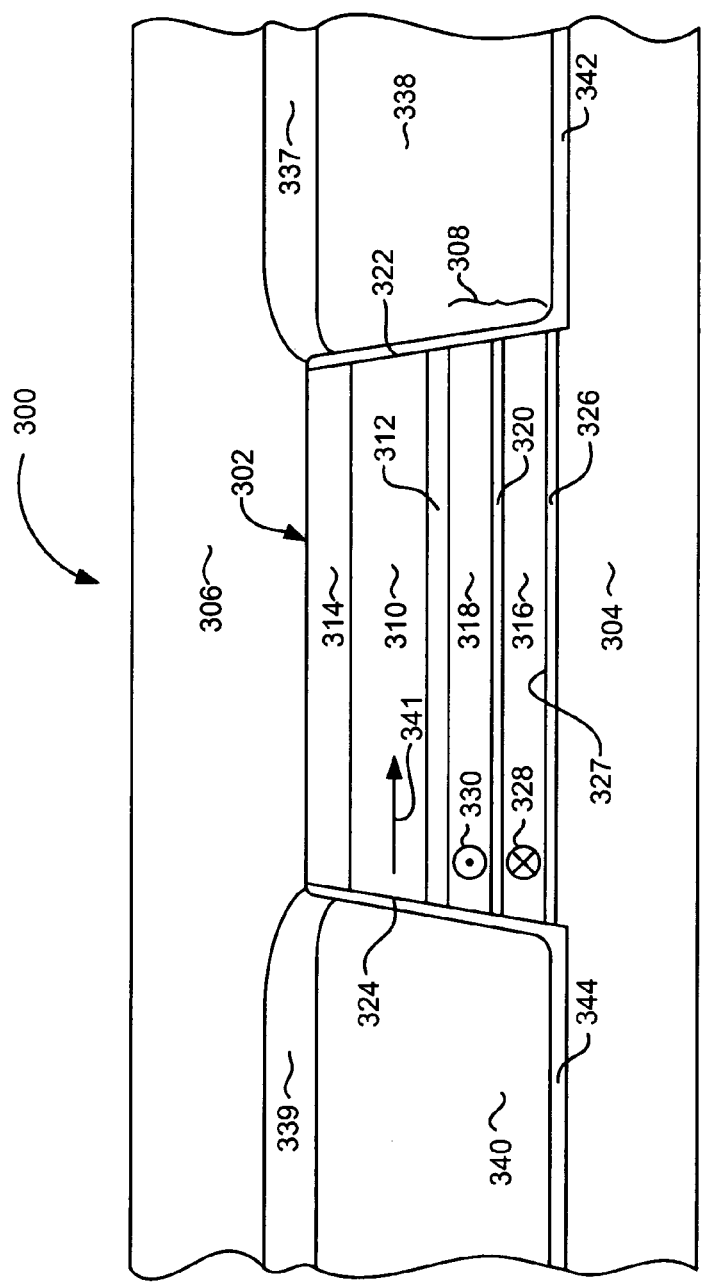
FIG. 3 is an ABS view of a magnetic sensor according to an embodiment of the present invention taken from circle 3 of FIG. 2.

With reference to FIG. 2, the orientation of the magnetic head 121 in a slider 113 can be seen in more detail. FIG. 3 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

With reference now to FIG. 3, a magnetoresistive sensor 300 according to an embodiment of the invention includes a sensor stack 302 sandwiched between first and second gap layers 304, 306. The sensor stack 302 includes a magnetic pinned layer structure 308 and a magnetic free layer 310. A non-magnetic, electrically conductive spacer layer 312, such as Cu, is sandwiched between the free layer 310 and the pinned layer structure 308. It should be pointed out that the invention could be embodied in a tunnel valve sensor, in which case the spacer layer 312 would be a non-magnetic, electrically insulating barrier layer. A capping layer 314, such as Ta, may be provided at the top of the sensor stack 302 to protect the sensor from damage during manufacturing, such as from corrosion during subsequent annealing processes.

The pinned layer 308 can be a simple pinned structure or an antiparallel (AP) pinned structure and is preferably an AP pinned structure including first and second magnetic layers (AP1) 316, and (AP2) 318 which may be for example CoFe antiparallel coupled across a thin AP coupling layer 320 such as Ru. The free layer 310 can be constructed of various magnetic materials such as NiFe or CoFe, and may include layers of CoFe and NiFe, preferably with a layer of CoFe or Co adjacent to the spacer 312 for optimal sensor performance. As can be seen with reference to FIG. 3, the sensor stack 302 has first and second laterally opposed sidewalls 322, 324 that define the track-width or active area of the sensor.

With continued reference to FIG. 3, the sensor 300 includes first and second hard magnetic, bias layers (HB layers) 338, 340. In addition, first and second leads 337, 339 are formed over the HB layers 338, 340. The leads 337, 339 may be constructed of, for example, Ta, Au, Rh or some other electrically conducting material. The HB layers 338, 340 are preferably constructed of an alloy containing Co, Pt and Cr, more specifically $Co_{80}Pt_{12}Cr_8$. The hard bias layers 338, 340 have a high magnetic coercivity, and are magnetostatically coupled with the free layer 310 to bias the magnetic moment of the free layer 310 in a direction parallel with the ABS as indicated by arrow 341.

Seed layers 342, 344 are provided beneath the HB layers 338, 340. The seed layers 342, 344 preferably extend over the laterally extending gap layer 304 layer as well as over the side walls 322, 324 of the sensor stack 302.

The pinned layer 308 is constructed upon a seed layer 326 that has a surface 327 that has been treated to provide it with an anisotropic roughness. This anisotropic roughness can be formed by a method that will be discussed below, and advantageously causes the magnetic layers 316, 318 of the pinned layer to have a strong magnetic anisotropy in a direction perpendicular to the ABS as indicated by arrows 328, 330.

The seed layer 326 can be for example NiFeCr, PtMn, IrMn, Ta, Ru or another suitable, preferably crystalline material. It should be pointed out that although seed layer 326 can be constructed of a material that could function as an antiferromagnetic (AFM) material if deposited sufficiently thick, the seed layer is preferably much thinner so that does not function as an AFM layer, but rather as a seed layer. The seed layer 326, is therefore preferably 20-90 Angstroms thick. However, the seed layer could be as thick as 120 Angstroms.

Figure 4:
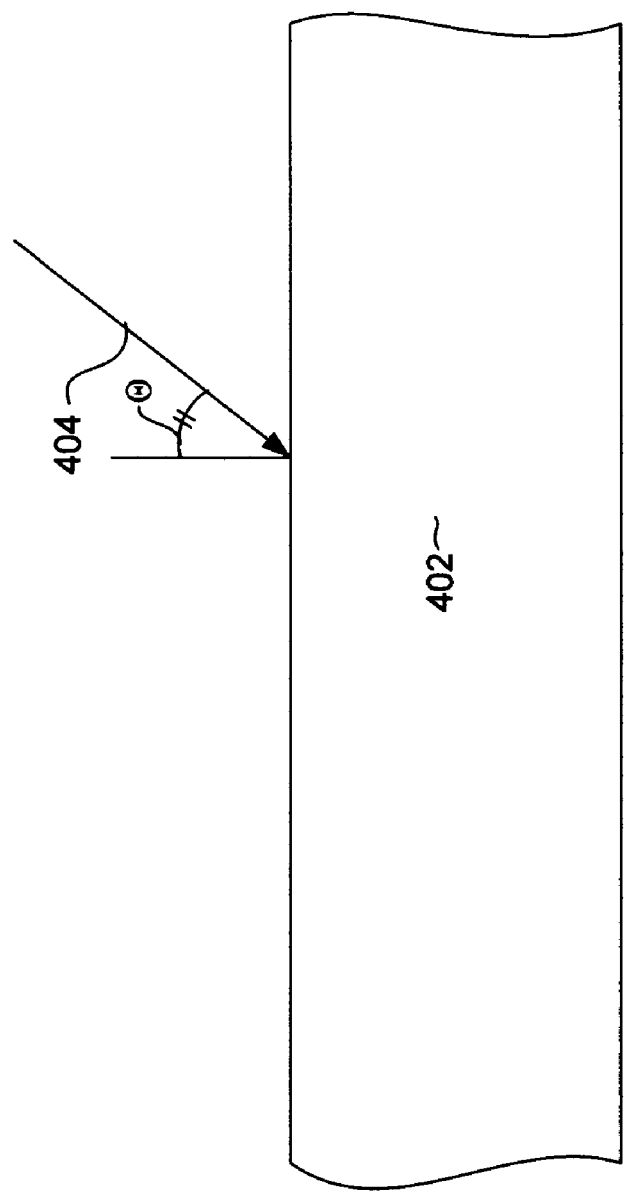
FIG. 4-6 are views illustrating a method of treating a surface with an anisotropic roughness.
Figure 5:
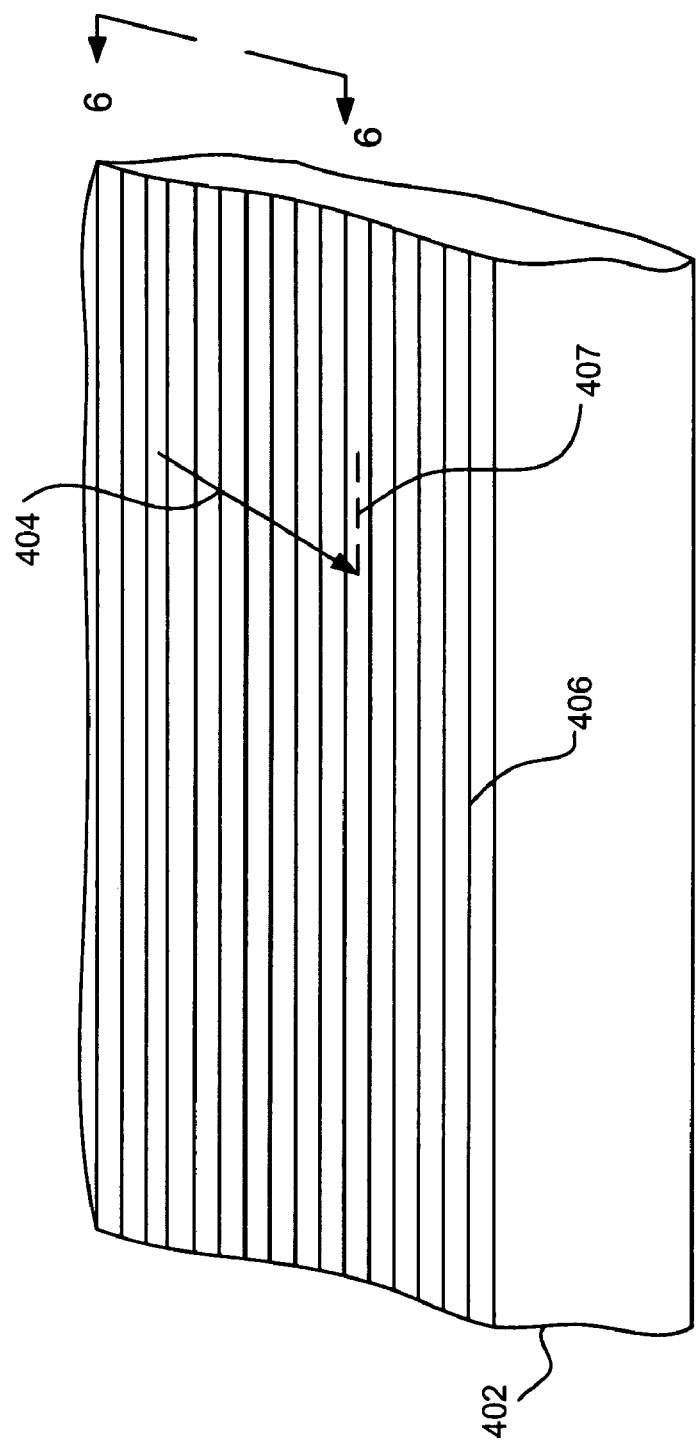
Figure 6:
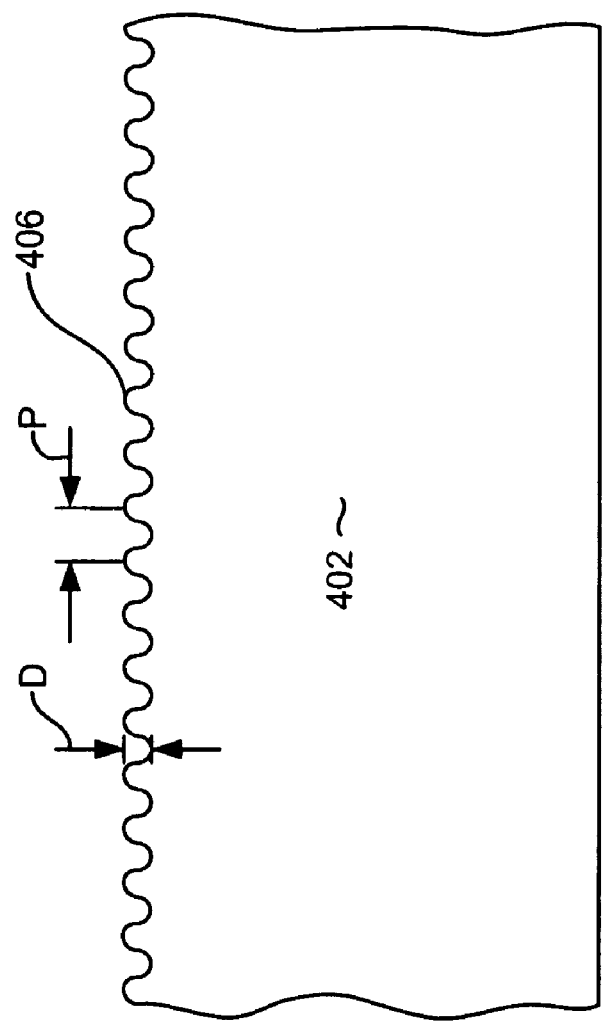

With reference to FIGS. 4-6, the surface treatment used to form an anisotropic roughness on the surface 327 of the seed layer 326 will be described in greater detail. With particular reference to FIG. 4, the seed 326 is constructed by depositing a material 402, which could be for example NiFeCr, PtMn, IrMn, Ta, Ru or another suitable, preferably crystalline material. A low power ion mill 404 is then performed at an angle Θ with respect to a normal to the surface of the seed layer 402. The ion mill 404 is preferably performed using a 9 zone ion extraction grid, and is performed at a voltage of 20-100 Volts or about 50 Volts. The seed layer material 402 can be for example 20 to 120 Angstroms prior to ion beam etching. The low power ion mill 404 can be performed for a time (duration) of about 100-1600 seconds.

The angled ion mill induces anisotropic roughness, for example in form of oriented ripples or facets 406 which can be seen with reference to FIGS. 5 and 6. The typical or average pitch P of the ripples 406 is between 1-200 nm, their average depth D is between 0.2 to 5 nm or about 0.5 nm. Although the ripples or facets 406 are shown as being uniform, it should be pointed out that this is for purposes of illustration only. The actual surface would include ripples 406 that are random and non-uniform, having varying depths and pitches and tending to be formed anisotropically as described above.

After the angled ion etch 404 has been performed sufficiently to form the desired ripples or facets 406, the AP1 layer 316 of the pinned layer structure 308 can be deposited, followed by the other sensor layers 312, 310, 314. It should be pointed out that these sensor layers are deposited at this point as full film layers, and the actual sensor shape shown in FIG. 3 will subsequently be formed by masking and ion milling (not shown).

The angled ion mill 404 is preferably performed at an angle Θ of between 20 and 80 degrees and is more preferably performed at an angle of between 35 and 65 degrees with respect to the normal to the surface of the seed layer 402. The exact voltage, current, and angle conditions depend on the type and characteristics of the ion source in use. The ion mill 404 is also preferably conducted without rotating the wafer, at such an angle that the projection 407 of the angle onto the plane of the seed layer 402 would be in a direction substantially parallel with the ABS of the sensor. Under certain circumstances, the projection 407 of the ion mill onto the surface of the seed layer 402 could be perpendicular to the ABS, but the important thing is that the resulting anisotropic roughness should generate a magnetic anisotropy pinned layer 308 that is in a direction that is oriented substantially perpendicular to the ABS.

Figure 7:
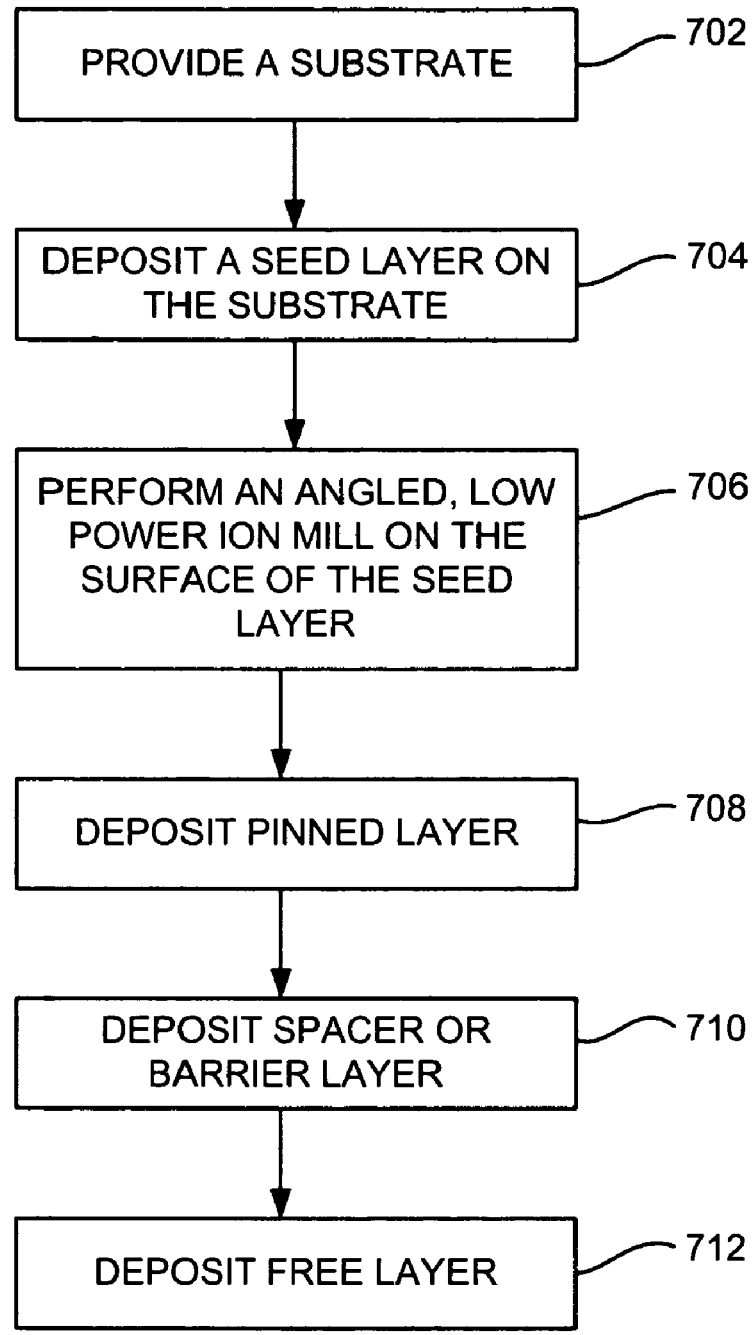
FIG. 7 is a flowchart illustrating a method of manufacturing a magnetoresistive sensor according to an embodiment of the invention.

With reference to FIG. 7, a method for constructing a sensor 300 is summarized. First in a step 702, a substrate is provided. The substrate can be for example the non-magnetic, electrically insulating gap layer 304 (FIG. 3) or, in the case of a CPP sensor, could be an electrically conductive lead material. Then, in a step 704, a seed layer is deposited. This seed layer can be, for example NiFeCr, PtMn, IrMn, Ta, Ru or some other (preferably crystalline) material. In a step, 706, the seed layer is ion milled using a low power ion mill at an angle relative to the seed layers. The ion mill is preferably performed at an angle of 20 to 80 degrees, or more preferably 35 to 65 degrees with respect to the surface of the seed layer. The ion mill is preferably performed at a voltage of 20-100 V using a 9 zone extraction grid and is performed without rotating the chuck. The ion mill is performed at such an orientation to form an anisotropic roughness in the seed layer that will cause a magnetic anisotropy in a later applied pinned layer structure, the anisotropic roughness being in a direction perpendicular to the air bearing surface (ABS). Then, in a step 708, a pinned layer structure is deposited. In a step 710 a non-magnetic electrically conductive spacer layer (electrically insulating barrier layer in the case of a tunnel valve) is deposited. Then, in a step 712 a free layer is deposited While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
a substrate;
a seed layer formed on the substrate, the seed layer having a surface configured with an anisotropic roughness;
a magnetic pinned layer structure formed on the surface of the seed layer;
a magnetic free layer; and
a spacer layer sandwiched between the free layer and the pinned layer structure.

2. A sensor as in claim 1 wherein the anisotropic roughness generates a magnetic anisotropy in the pinned layer structure.

3. A sensor as in claim 1 wherein the sensor has an air bearing surface (ABS) and wherein the anisotropic roughness of the surface of the seed layer causes a magnetic anisotropy in the pinned layer structure that is oriented substantially perpendicular to the ABS.

4. A sensor as in claim 1 wherein the anisotropic roughness in the surface of the seed layer comprises ripples.

5. A sensor as in claim 1 wherein sensor has an air bearing surface (ABS) and wherein the anisotropic roughness in the surface of the seed layer comprises ripples extending along a direction that is substantially parallel with the ABS.

6. A sensor as in claim 1 wherein the seed layer is a crystalline material.

7. A sensor as in claim 1 wherein the seed layer comprises a material selected from the group consisting of NiFeCr, PtMn, IrMn, Ta and Ru.

8. A sensor as in claim 1 wherein the substrate comprises a non-magnetic, electrically insulating gap layer.

9. A sensor as in claim 1 wherein the substrate comprises a magnetic, electrically conductive shield layer.

10. A sensor as in claim 1 wherein the anisotropic roughness comprises ripples having an average pitch of 1-200 nm.

11. A sensor as in claim 1 wherein the anisotropic roughness comprises ripples having an average depth of 0.2 -5 nm.

12. A sensor as in claim 1 wherein the seed layer has a thickness of 20 -120 Angstroms.

13. A magnetoresistive sensor, comprising:
a magnetic free layer;
a magnetic pinned layer structure;
a non-magnetic, electrically conductive spacer layer sandwiched between the free layer and the pinned layer, and
a seed layer contacting the pinned layer structure, the seed layer having a surface adjacent to the pinned layer structure that is configured with an anisotropic roughness.

14. A magnetoresistive sensor as in claim 13 wherein the seed layer comprises a crystalline material and wherein the anisotropic roughness causes a magnetic anisotropy in the pinned layer structure.

15. A magnetoresistive sensor as in claim 13 wherein the seed layer comprises a material selected from the group consisting of NiFeCr, PtMn, IrMn Ta and Ru.

16. A magnetoresistive sensor, comprising:
a magnetic free layer;
a magnetic pinned layer structure;
a non-magnetic, electrically insulating barrier layer sandwiched between the free layer and the pinned layer; and
a seed layer contacting the pinned layer structure, the seed layer having a surface adjacent to the pinned layer structure that is configured with an anisotropic roughness.

17. A magnetoresistive sensor as in claim 16 wherein the seed layer is a crystalline material and the anisotropic roughness causes a magnetic anisotropy in the pinned layer structure.

18. A magnetoresistive sensor as in claim 16 wherein the seed layer comprises a material selected from the group consisting of NiFeCr, PtMn, IrMn Ta and Ru.

* * * * *